(12) United States Patent
Elend

(10) Patent No.: US 10,768,228 B2
(45) Date of Patent: Sep. 8, 2020

(54) COMMUNICATION CIRCUITRY INTEGRITY ASSESSMENT

(71) Applicant: NXP B.V., Eindhoven (NL)

(72) Inventor: Bernd Uwe Gerhard Elend, Hamburg (DE)

(73) Assignee: NXP B.V., Eindhoven (NL)

( * ) Notice: Subject to any disclaimer, the term of this patent is extended or adjusted under 35 U.S.C. 154(b) by 233 days.

(21) Appl. No.: 15/946,460

(22) Filed: Apr. 5, 2018

(65) Prior Publication Data
US 2019/0310317 A1    Oct. 10, 2019

(51) Int. Cl.
*G01R 31/317* (2006.01)
*H04L 12/40* (2006.01)
*H04L 12/26* (2006.01)

(52) U.S. Cl.
CPC .. *G01R 31/31706* (2013.01); *G01R 31/31703* (2013.01); *H04L 12/40* (2013.01); *H04L 43/50* (2013.01); *H04L 2012/40215* (2013.01)

(58) Field of Classification Search
CPC ............ G06F 11/1068; G06F 11/1072; H03M 13/1171; H03M 13/1108; H03M 13/1111; G11C 29/52; G01R 31/31706; G01R 31/31703; H04L 43/50; H04L 43/40
See application file for complete search history.

(56) References Cited

U.S. PATENT DOCUMENTS

| | | | |
|---|---|---|---|
| 6,600,723 B1 | 7/2003 | Reeb et al. | |
| 8,861,370 B2 | 10/2014 | Deb et al. | |
| 9,329,919 B2 | 5/2016 | Picket et al. | |
| 2012/0155285 A1 | 6/2012 | Smart et al. | |
| 2015/0105973 A1 | 4/2015 | Cicala et al. | |
| 2017/0220518 A1* | 8/2017 | Sengoku | G06F 13/4282 |
| 2017/0300444 A1* | 10/2017 | Maletsky | G06F 13/4027 |
| 2017/0346596 A1 | 11/2017 | Desimone et al. | |
| 2018/0287642 A1* | 10/2018 | Hell | H03K 5/1252 |
| 2018/0302165 A1* | 10/2018 | Truong | G02B 6/30 |
| 2019/0129778 A1* | 5/2019 | Olson | G06F 11/3027 |
| 2019/0288870 A1* | 9/2019 | de Haas | H04B 3/46 |

FOREIGN PATENT DOCUMENTS

WO    2018013171 A1    1/2018

* cited by examiner

*Primary Examiner* — Dominic E Hawkins
(74) *Attorney, Agent, or Firm* — Rajeev Madnawat

(57) ABSTRACT

Aspects of the present disclosure are directed to assessing integrity of communications circuitry. As may be implemented in accordance with one or more embodiments, a circuit node carries out a test protocol utilizing characteristics of a communication protocol to detect potential integrity issues. An initial test bit sequence is transmitted to circuit nodes connected to signal lines of a bus, by providing a test voltage across the signal lines that is less than an operating voltage potential of the bus. An ensuing state of the bus is sensed, and integrity of the bus or of circuitry connected to the bus is assessed based on the sensed state of the bus and on a state that the bus is expected to be in after transmission of the initial test bit sequence, which is used as an indication of whether all of the circuit nodes received the initial test bit sequence.

20 Claims, 5 Drawing Sheets

COMMUNICATION CIRCUITRY INTEGRITY ASSESSMENT

OVERVIEW

Aspects of various embodiments are directed to assessing integrity of communication circuitry, as may be implemented for communications over a data bus.

Communication circuits for a variety of applications involve the use of various types of circuit connections. For instance, wire harnesses can be utilized to connect network nodes to a data bus. One such example network is a CAN (controller area network) system in which a message-based communications bus protocol is utilized. The CAN bus protocol is often used in motor vehicles, such as in the automotive and marine industries, and can be used to enable communications between various electronic control units (ECUs), such as engine control module (ECM), a power train control module (PCM), airbags, mirror adjustment, battery and recharging systems for hybrid/electric cars, and many more.

Communications circuitry in such data bus applications can be susceptible to manufacturing defects, damage, wear over time and other integrity issues. Assessing the integrity of such communications circuitry can be challenging. For instance, wire harnesses may function despite having integrity issues such as those due to increasing resistance of (in-line) connectors, which may attenuate the signal amplitude. Under such conditions, communication might still be possible, but may drop out if the resistance increases further. Also, a broken wire might remain undetected when split terminations utilize "big" capacitors, because a receiving node still sees a sufficiently large differential voltage (even if close to a threshold differential that is detectable by the receiver). Over time, these integrity issues can become worse and, in some instances, result in improper data communication. Left undetected, such integrity issues can result in an unexpected failure.

These and other matters have presented challenges to a variety of communications, for a variety of applications.

SUMMARY

Various example embodiments are directed to issues such as those addressed above and/or others which may become apparent from the following disclosure concerning communications over a data bus. Such embodiments may facilitate assessment of the integrity of circuits (e.g., wire harnesses) that connect respective nodes on the bus or the nodes themselves.

In certain example embodiments, aspects of the present disclosure involve transmitting test signals with a differential signal that is reduced relative to a design differential signal for a system. The reduced differential signal can be used to expose issues with connecting circuitry or circuit nodes, which may not be detectable at the design differential signal. For instance, wire harnesses having relatively weak connections may work fine under a design differential signal, but fail to pass signals exhibiting a reduced differential signal. This characteristic is used to assess the robustness of wire harnesses and provide an indication of potential future issues/failure thereof.

In a more specific example embodiment, a method and/or related apparatus carry out a test protocol as follows. An initial test bit sequence is transmitted to a plurality of circuit nodes connected to signal lines of a bus, by providing a test voltage across the signal lines in accordance with the test protocol. The test voltage potential is less than an operating voltage potential at which the circuit nodes connected to the bus operate for communicating bits according to a communication protocol. As such, the reduced voltage potential can be used for assessing the ability of the respective circuit nodes to receive a reduced-voltage signal. Specifically, the state of the bus is sensed after the initial test bit sequence has been transmitted, and integrity of the bus or of circuitry connected to the bus is assess by determining whether all of the circuit nodes received the initial test bit sequence. This determination is made based on the sensed state of the bus and on a state that the bus is expected to be in after transmission of the initial test bit sequence, as specified via the communication protocol (e.g., by detecting an error bit sent in accordance with the communication protocol, by one of the circuit nodes that did not receive the initial test bit sequence). Upon determining that one or more of the circuit nodes did not receive the initial test bit sequence, an output indicative of a potentially faulty circuit connection to one of the circuit nodes can be generated.

In some instances, detecting that one of the circuit nodes did not receive the initial test bit sequence includes detecting that the sensed state of the bus is indicative of a response from the one of the circuit nodes that is different than an expected response of the one of the circuit nodes to the initial test bit sequence. For instance, where one of the circuit nodes responds to a signal transmitted by of one of the other circuit nodes responding to the initial test bit sequence, this response can be indicative of a failure to receive the (low differential) test signal, but receiving the (higher differential) response from the other circuit node transmitting at the higher (operating) differential.

In accordance with a more specific embodiment, an apparatus includes a microcontroller, a transmitter configured and arranged to transmit signals from the microcontroller to signal lines of a bus, and a receiver configured and arranged to receive signals communicated over signal lines of the bus and to provide the received signals to the microcontroller. The microcontroller is configured and arranged with the transmitter and the receiver to carry out a test protocol for assessing integrity of the bus or of circuitry connected to the bus as follows. An initial test bit sequence is transmitted to a plurality of circuit nodes connected to the bus by providing a test voltage across the signal lines, the test voltage potential being less than an operating voltage potential at which the circuit nodes connected to the bus operate for communicating bits. After transmitting the initial test bit sequence, a state of the bus is sensed via the receiver and used for determining whether all of the circuit nodes received the initial test bit sequence, based on a state that the bus is expected to be in after transmission of the initial test bit sequence.

In another specific example embodiment, an apparatus includes a data bus including two signal lines and a plurality of circuit nodes connected to the bus. Each circuit node is configured and arranged to communicate signals on the bus serially, relative to the other circuit nodes, by providing a voltage potential across the signal lines in accordance with a communications protocol. At least one of the plurality of circuit nodes includes logic and transmission circuitry configured and arranged to assess integrity of the bus or of circuitry connecting the plurality of circuit nodes to the bus as follows. A test signal is transmitted on the bus, and which exhibits a voltage potential and timing that causes other ones of the plurality of circuit nodes that receive the test signal to generate a response signal in accordance with the communications protocol. When a detected response from one of the circuit nodes is indicative that the one of the circuit nodes failed to receive the test signal yet also received the response signal from one of the other circuit nodes (in accordance with the communications protocol), an output indicative of a potential failure in the one of the circuit nodes is generated.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
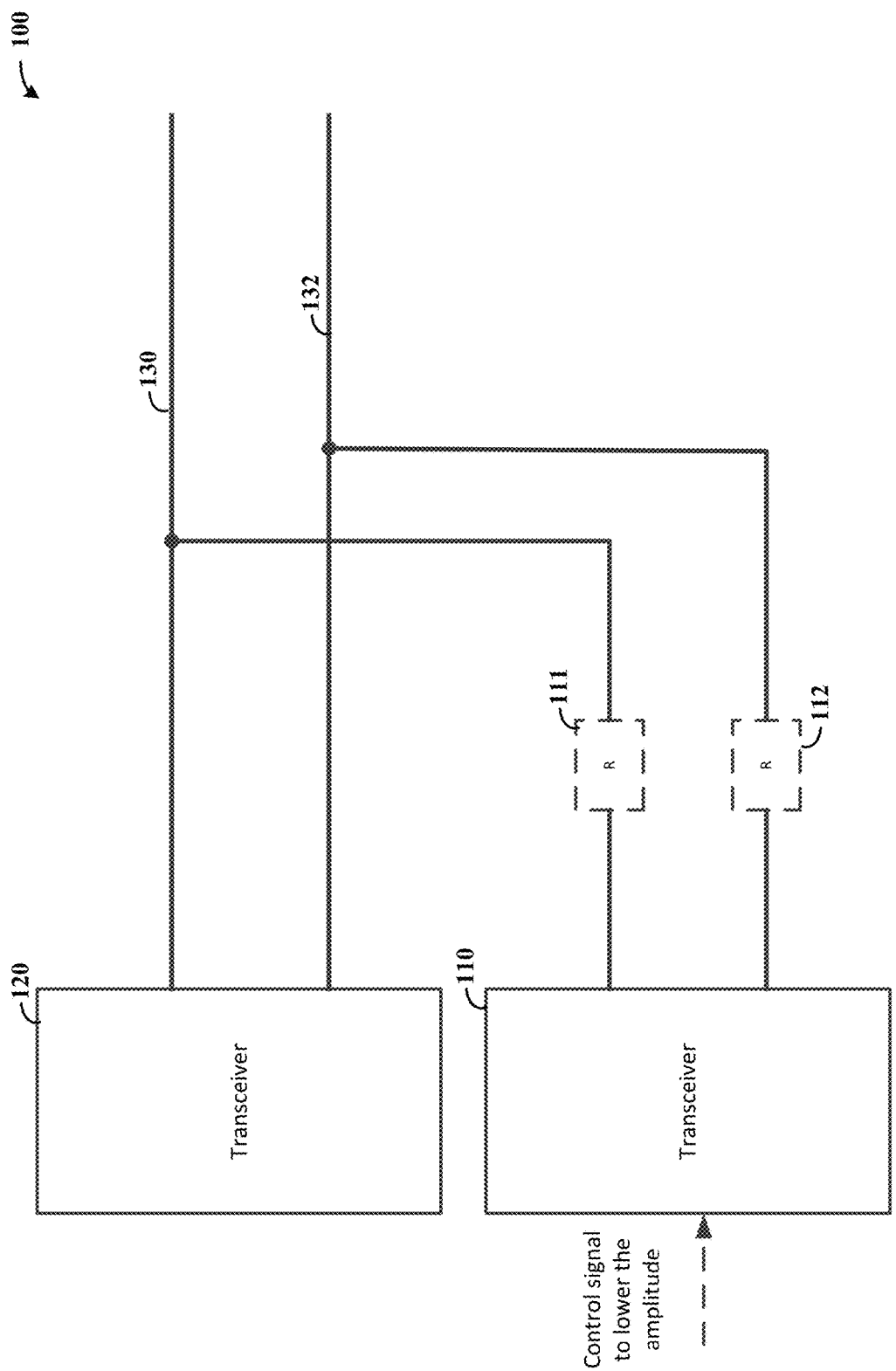
FIG. 1 shows communication circuitry, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving communications over a data bus, such as a serial data bus. In certain implementations, aspects of the present disclosure have been shown to be beneficial when used in the context of communications utilizing a voltage differential to communicate data, and to assessing the integrity of circuitry involved in the data communication. While not necessarily so limited, various aspects may be appreciated through the following discussion of non-limiting examples, which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination. For instance, one of the transceivers shown in FIG. 1 may be implemented in one, two, or more network nodes shown in FIG. 5.

Specific embodiments are directed to diagnosing whether a Classical CAN or CAN FD communication is robust or close to failure due to unwanted signal attenuation/degradation caused by the wiring harness. Such diagnoses can be carried out at a manufacturing stager, or later in the life of the use of a Classical CAN, CAN FD or successor such as, e.g., CAN EL bus. Such failure diagnosis can be used to indicate whether all nodes on such a bus see a sufficiently high differential voltage during the reception of CAN frames. Particular embodiments involve assessing whether all nodes see a differential signal with sufficient margin above the thresholds at which the respective receivers in each node are able to see the differential signal. This can be effected by providing a signal with a reduced voltage differential; if all nodes can see the signal, it can be ascertained that each node sees a design (higher) voltage differential, with at least the threshold corresponding to the reduced voltage differential. In certain implementations, a testing approach using a reduced voltage differential is carried out in the time between two CAN frames, during normal operation of the CAN system.

In some embodiments, a standard CAN transceiver is connected to a CAN bus with series resistances in high and low (CAN_H and CAN_L) signal lines. Transceiver (TXD) and receiver (RXD) pins are connected to general purpose I/O (GPIO) pins of a microcontroller. The series resistances reduce the voltage differential that the CAN transceiver applies to the CAN bus, for testing purposes. The CAN transceiver and series resistances can be implemented as a dedicated test transceiver, or with switching circuits that selectively place the resistances in series between the CAN transceiver and the high and low signal lines. Further, such a resistance can be applied to only one of the high and low signal lines, which causes a reduction in voltage on the line it is connected to (and an overall reduction in differential voltage across the respective signal lines).

In other embodiments, a CAN transceiver is configured to send a signal to one or both of the high and low signal lines with a lower amplitude, which results in a lower voltage differential that can be used in testing as characterized herein. Such a signal may involve the communication of a dominant bit having a lower differential voltage than an expected operational differential voltage (e.g., in accordance with ISO11898-2:2016 as may be implemented for road vehicles). Still other embodiments may utilize a combination of series resistances and transceiver-effected amplitude reduction.

Circuit testing can be carried out on two-wire (high/low) bus circuitry as follows, in accordance with one or more embodiments. A transceiver microcontroller pulls a transmission signal (TXD) low for a single arbitration bit time, thus sending a single dominant test bit or a test bit sequence (e.g., one or more bits). This dominant bit (e.g., an initiating bit) occurs with reduced differential voltage (relative to an operating differential voltage, such as in accordance with that specified in ISO11898-2:2016). The reduced voltage differential can be effected via additional series resistors and/or transceiver/microcontroller functions.

The receiver terminal (RXD) on the transceiver is used to monitor the bus for any response from other circuit nodes.

Based on this response (or lack thereof), it can be determined whether one of more of the other circuit nodes was unable to receive the test bit. For instance, it can be determined how long a low pulse is observed on RXD, which is a result of overlapping error (or overload) flags. If the low pulse on RXD lasts 7 bit times (corresponding to the initiating dominant bit plus reactive CAN error or overload flags transmitted by the other nodes under ISO11898-2:2016 protocols), it is guaranteed that all nodes have received the single dominant bit. In such an instance, the testing protocol indicates that communications with all nodes passes under the utilized subthreshold voltage differential.

If the low pulse occurs with a length of 8 or more bit times (under ISO11898-2:2016), this is an indication that at least one node has not received the initiating dominant bit. For instance, if a node does not see the initiating dominant bit it may instead respond to the reactive CAN error or overload flags). In such an instance, it is determined that there is an insufficient margin between the voltage differential of the initial dominant test bit and the threshold of the receiver of the one (or more) nodes that did not receive the initial dominant test bit with the specifically-adjusted reduced voltage differential. In response to such a determination, it can be concluded that there is a risk of communication failure, particularly if the properties of the tested circuitry (e.g., wire harness) degrade further.

In some instances, upon detection of such a failure, a further test is performed using a differential voltage that is higher than that of the initial test bit, but below the operating differential voltage as noted above. This further test can be carried out to determine whether the node or nodes that failed until the initial test bit will fail at a higher differential voltage. The process can be reiterated at higher or lower differential voltages (based on a pass or fail with a currently-tested differential voltage) to more accurately identify a threshold differential voltage at which failure occurs. This approach can provide a more accurate indication of the long-term viability of the circuitry being tested.

The test protocol can be carried out under one or more of a variety of conditions. In some embodiments, an initiating test bit is sent is at the last bit of end-of-frame field for the CAN protocol, in response to which other CAN nodes receiving the initiating test bit will interpret the initiating test bit as an overload flag, and thus not increase the receive error count.

In accordance with one or more embodiments, an apparatus utilized for assessing integrity of communication circuity includes a microcontroller, a transmitter, and a receiver, such as may be implemented in a circuit node on a communication bus (e.g., a CAN or LIN bus). The apparatus transmits signals from the microcontroller to signal lines of a bus via the transceiver, and receives signals into the microcontroller via the receiver. The microcontroller operates with the transmitter and receiver (or transceiver) to carry out a test protocol for assessing the integrity of the bus or of circuitry connected thereto, as follows. An initial test bit sequence (e.g., one or more bits) is transmitted to all circuit nodes connected to the bus, by providing a test voltage across the signal lines having a potential that is less than an operating voltage potential at which the circuit nodes connected to the bus operate. This approach, in essence, tests the ability of the circuit nodes to receive a reduced-potential signal, which can be challenging to communicate over signal lines experiencing integrity issues, such as those that have degraded over time. Specifically, a state of the bus is sensed via the receiver after the initial test bit sequence has been transmitted.

The sensed state is used for determining whether all of the circuit nodes received the initial test bit sequence, based on a state that the bus is expected to be in after transmission of the initial test bit sequence. For instance, if the sensed state is different than expected, it can be surmised that one of the circuit nodes did not receive the initial test bit sequence. Such a difference may arise, for example, when a circuit node connected with a faulty wire harness fails to see the test bit sequence at the low voltage differential, but does indeed see an ensuing response to the test bit sequence by one of the other circuit nodes as such an ensuing response is sent at a higher operating voltage differential. As each of the circuit nodes must follow a set communications protocol, the expected responses to such a protocol are predictable and, as such, can be utilized for detecting whether the test bit sequence is received. Moreover, such a communications protocol can be utilized to carry out the test protocol without interrupting normal communications, such as by transmitting the test bit sequence between known communication frames as ascertained via the communications protocol and timing synchronization between the circuit nodes. Where no response is detected, it can be determined that none of the circuit nodes received the test bit sequence. An output indicative of the detected integrity issues can be generated and used to ascertain that the system may be susceptible to failure.

The voltage differential used for the test protocol can be set in accordance with various needs. In some instances, the voltage differential is set high enough to trigger all circuit nodes on the bus by design, in accordance with a design safety margin. For instance, if the receivers at each circuit nodes are designed to operate at up to 10% lower voltage potential than a design voltage differential of the system, the test protocol can utilize such a voltage potential to assess whether all of the receivers will indeed receive signals at that reduced voltage. If an affirmation can be made, it can be assured with greater confidence that the circuit nodes will all receive communications made at the higher operating voltage of the system. This can be useful, for example, in applications in which ensuring such communications is important for proper operation. The test voltage differential may also account for signal attenuation. By setting the differential higher than a target test differential, such that the resulting voltage provided to each circuit node is at the expected target test differential.

As discussed herein, a variety of different types of communications circuitry can be assessed in accordance with one or more embodiments. For instance, the bus may be implemented as a serial bus over which the microcontroller and circuit nodes communicate in accordance with a serial communication protocol. The sensed state of the bus can be assessed in accordance with an expected state of the bus as dictated by the serial communication protocol and the initial test bit sequence. Such a serial bus may operate in dominant and recessive states for respectively communicating dominant bits and recessive bits. The state may exhibit the operating voltage potential and the recessive state may exhibit about no voltage differential between the signal lines. An amount of time that the bus exhibits the dominant state or an amount of time that the bus exhibits the recessive state can be indicative of whether all of the circuit nodes received the initial test bit sequence, depending on the communications protocol and the expected amount of time for each state.

In a more particular embodiment, the bus is a two-wire bus that communicates dominant and recessive bits in accordance with a dominant state and a recessive state, in which the dominant state exhibits a voltage differential between the two wires. The microcontroller determines that one of the circuit nodes did not receive the initial test bit sequence when an amount of time that the bus exhibits the dominant state exceeds an expected amount of time that the bus exhibits the dominant state. This may involve, for example, detecting a dominant error bit sent by the node that did not receive the initial test bit sequence, or an detecting an amount of dominant error bits indicative of a protocol error detected by the node that did not receive the initial test bit sequence.

Test signals may be generated in a variety of manners. In some embodiments, test signals are attenuated using resistor circuits. In other embodiments, a microcontroller generates the test signals at reduced amplitudes, relative to a design amplitude. Further, multiple test signals may be generated. For instance, iterative test signals at higher or lower potential relative to an initial test bit sequence can be generated to assess operation of the circuit nodes at the various potentials. This iterative approach can be carried out until one of the circuit nodes fails to receive the initial test bit sequence.

Known communication protocols can be exploited for assessing the integrity of communications circuitry in a variety of manners, utilizing a lower voltage potential as characterized herein. In some embodiments, an initial test bit sequence is transmitted between respective communication frames defined by a communication protocol being implemented by the circuit nodes on the bus, where the protocol dictates that communications are not to be carried out at such a time. Accordingly, those circuit nodes sensing the test bit sequence may respond by generating an error signal, and such a response can be used to assess the circuitry. Those circuit nodes that fail to sense the test bit sequence but that do sense the error signal, may generate a further error signal that may also be detected and used for facilitating evaluation of the circuit nodes. This can be carried out without using time frames otherwise used for communication in accordance with the communication protocol.

Turning now to the figures, FIG. 1 shows communication circuitry 100, in accordance with the present disclosure. A transceiver 110 is configured to provide a test signal on communication signal lines 130 and 132 for communication with one or more of a plurality of transceivers coupled to the signal lines, with transceiver 120 shown by way of example. The test signal is provided with a voltage differential (e.g., potential) across the signal lines 130 and 132, for reception by the transceivers. This voltage differential is reduced, relative to a design voltage potential, to test the ability of the other transceivers to receive (and recognize) a signal at a lower differential. The transceiver then listens for responses from the other transceivers and, based on the responses, ascertains whether one or more of the other transceivers did not receive the test signal.

The transceiver 110 operates to provide a test voltage having a reduced potential between lines 130 and 132 in one or more of a variety of manners. In some embodiments, the communication circuitry 100 includes resistors 111 and 112, which operate to reduce the amplitude of the signals presented by the transceiver 110. This approach facilitates the use of a transceiver that transmits signals at a design operating voltage for test purposes, by attenuating the output of the transceiver. The resistors 111 and 112 may be placed external to the transceiver 110 as shown, or internal to the transceiver.

In other embodiments, the transceiver 110 is operable to generate test signals at a reduced amplitude, relative to operational signals. This may be carried out, for example, in response to a control signal as shown in the figure. Further, this approach may also utilize resistors 111 and 112 to also attenuate the generated test signals.

As used herein, a transceiver refers to circuitry that facilitates transmission and reception of data. Some or all of the circuitry for data transmission may be shared as circuitry utilized for data reception. Such a transceiver may utilize separate circuitry for data transmission and reception, respectively. Further, a transceiver may refer to a network node having a microcontroller or other logic circuitry therein, or may operate with a separate microcontroller or logic circuitry that provides signals for transmission and process received signals.

Figure 2:
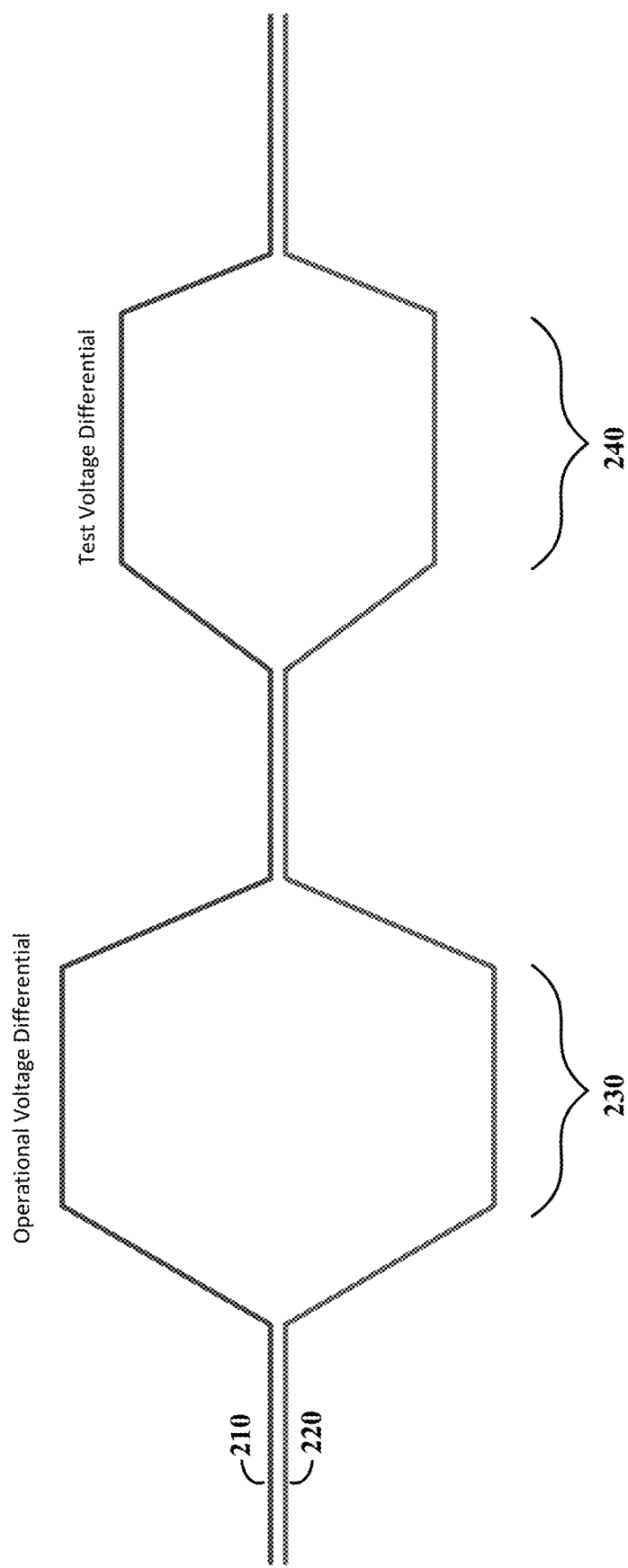
FIG. 2 is a signal diagram illustrating an exemplary voltage differential that can be utilized for testing, in accordance with the present disclosure.

FIG. 2 is a signal diagram illustrating an exemplary voltage differential that can be utilized for testing, in accordance with the present disclosure. Signal 210 is transmitted on a first signal line, and signal 220 is transmitted on a second signal line. Such signal lines may, for example, be signal lines of a two-wire bus in which a voltage potential between the lines, or lack thereof, is interpreted as data bits (e.g., with the presence of a voltage potential/differential being indicative of a dominant bit or "1," and the absence of a voltage potential/differential being indicative of a recessive bit or "0"). By way of example, an operational voltage differential is shown at 230, and a test voltage differential is shown at 240. In this context, the test voltage potential can be provided with signals having respective amplitudes that result in a lower voltage different between the signals 210 and 220 carried on respective signal lines.

The reduction in the test voltage differential 240, relative to the operational voltage differential 230, can be set in accordance with a design standard implemented for ensuring robust communication. For instance, where circuit nodes are expected to continue to operate properly at 90% of full operational voltage differential, the test voltage differential can be set at 90% of the operational voltage differential. Alternatively, the test voltage differential can be set below 90% (e.g., at 85%), to detect whether any of the circuit nodes is subject to potential failure while operating at 90% of a design voltage differential.

Figure 3:
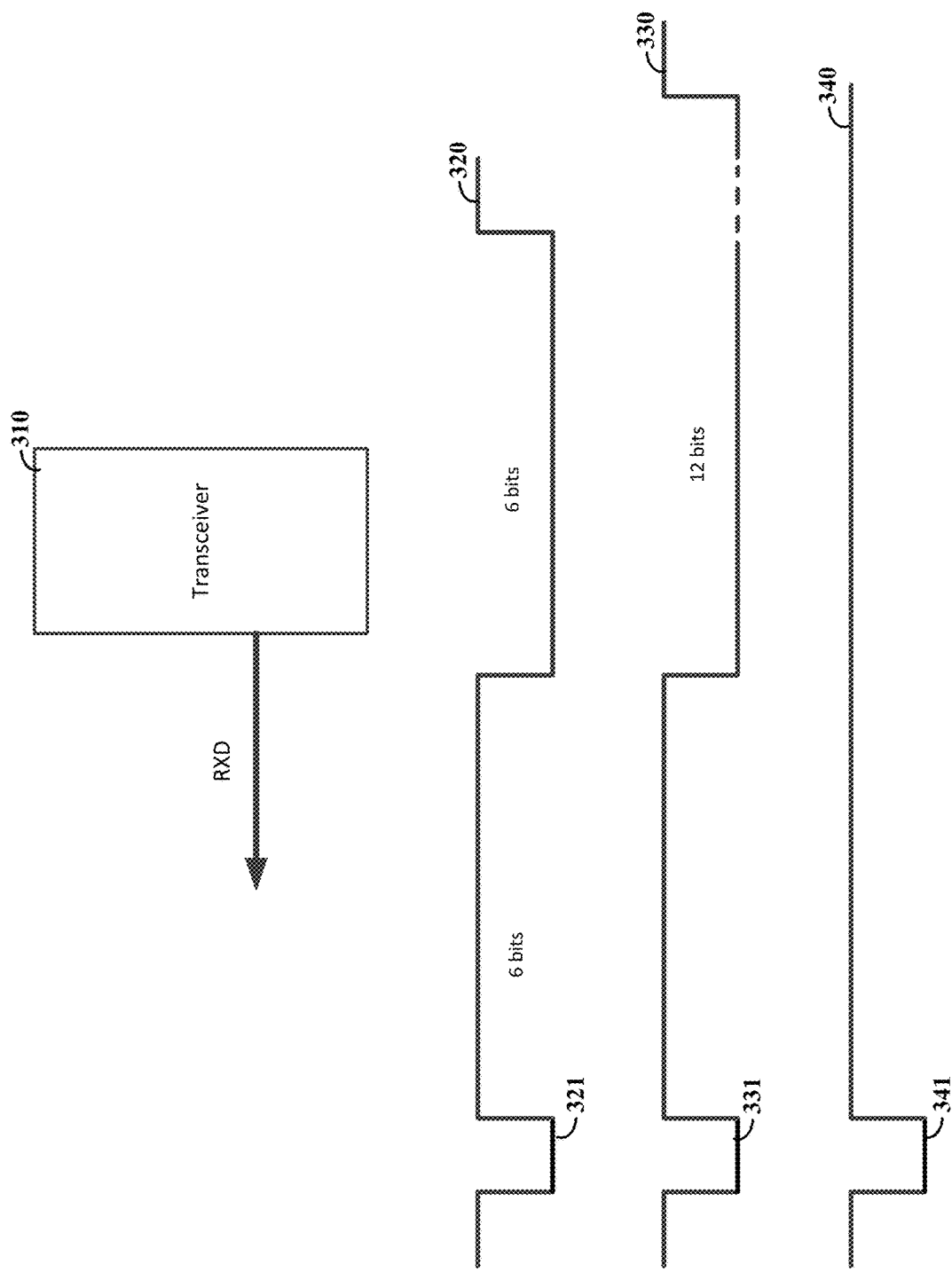
FIG. 3 shows a transceiver circuit and plots of test data for a testing approach, in accordance with the present disclosure.

FIG. 3 shows a transceiver circuit 310 along with plots of test data for a testing approach implemented via the transceiver circuit (e.g., with a CAN protocol), in accordance with the present disclosure. Signal 320 corresponds to an instance in which nodes on a communication bus respond as expected to an initial test bit 321, provided at a lower amplitude relative to a design signal amplitude for systems in which the transceiver circuit 310 can be implemented. The initial test bit 321 may, for example, be a dominant test sent during an idle phase of the transceiver 310. Such a signal may be detected on the receiver (RXD) terminal of the transceiver 310.

Signal 330 corresponds to an instance in which less than all nodes on the communication bus are able to receive initial test bit 331 with a lower amplitude. For instance, nodes receiving the initial test bit may responds as shown at signal 320. Those nodes that did not receive the initial test bit 331 then react, due to not receiving the initial test bit, by communicating additional bits after the six bit response shown in signal 320. Signal 340 represents an instance in which none of the other nodes on the communication bus were able to receive test bit 341 with the lower amplitude, as no response is detected.

The test signals shown, and the expected responses, may vary depending on the communication protocol used as well as the test protocol that is used. For example, responses occurring sooner than 6 (recessive) bits after an initial (dominant) test bit may be carried out in accordance with certain protocols. Similarly, shorter or longer further responses by the circuit nodes on the network may also be implemented. These design changes may be implemented in accordance with one or more embodiments involving the use of reduced amplitude signals.

Figure 4:
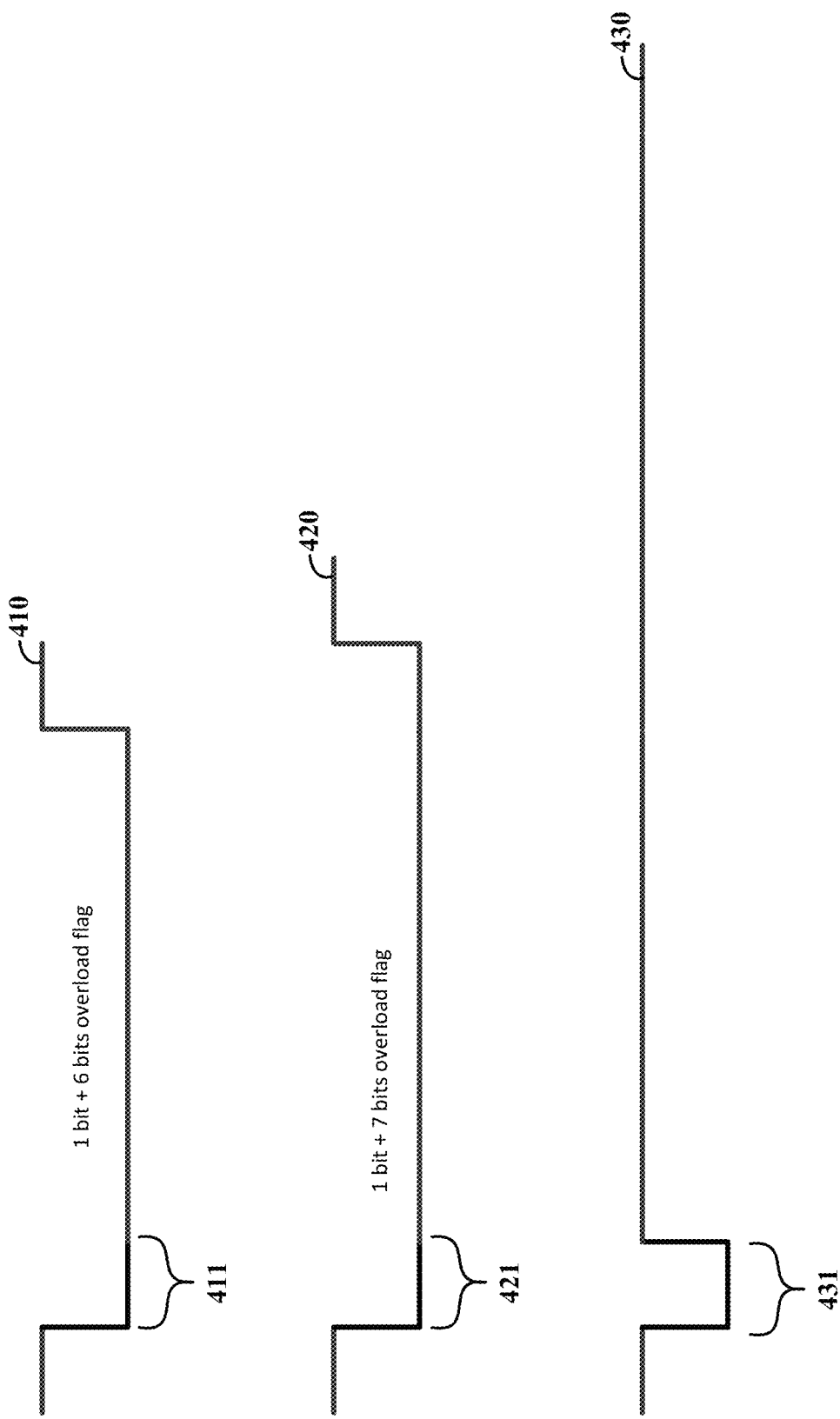
FIG. 4 shows plots of test data utilizing another testing approach, in accordance with the present disclosure.

FIG. 4 shows plots of test data signals involving another testing approach, in accordance with the present disclosure. Referring to signal 410, a dominant test bit 411 is sent during the last bit of the end-of-frame (EOF) communication on a communication line by a transceiver, with the test bit 411 having a lower than design differential amplitude that should be, by design, sufficient to pass thresholds of all receivers on the communication line when those receivers are operating and connected properly. This placement of a dominant bit in the last bit position of the EOF communication is interpreted by other receiving nodes on the signal lines as an overload flag. These other nodes then respond with a reactive overload flag, shown as 6 bits in signal 410 occurring immediately after the dominant test bit 411. This approach can be implemented, for example, without increasing error counters when used with CAN nodes, and mitigates potential collisions with the start of an ensuing frame.

Referring to signal 420, dominant test bit 421 is read, followed by 7 bits of an overload flag. This represents an instance in which one or more nodes did not receive the dominant test bit 421, which results in the one or more nodes failing to initially respond immediately after the dominant test bit. However, when the one or more nodes see the initial overload flag bit as transmitted by those nodes that did see the initial dominant test bit 421, that node or nodes transmit an overload flag that results in going beyond the initial 7 bits shown in signal 410. This can thus be used to detect that the one or more nodes did not see the initial overload flag bit. Finally, signal 430 is representative of an instance in which no other nodes receive the initial dominant test bit 431.

Figure 5:
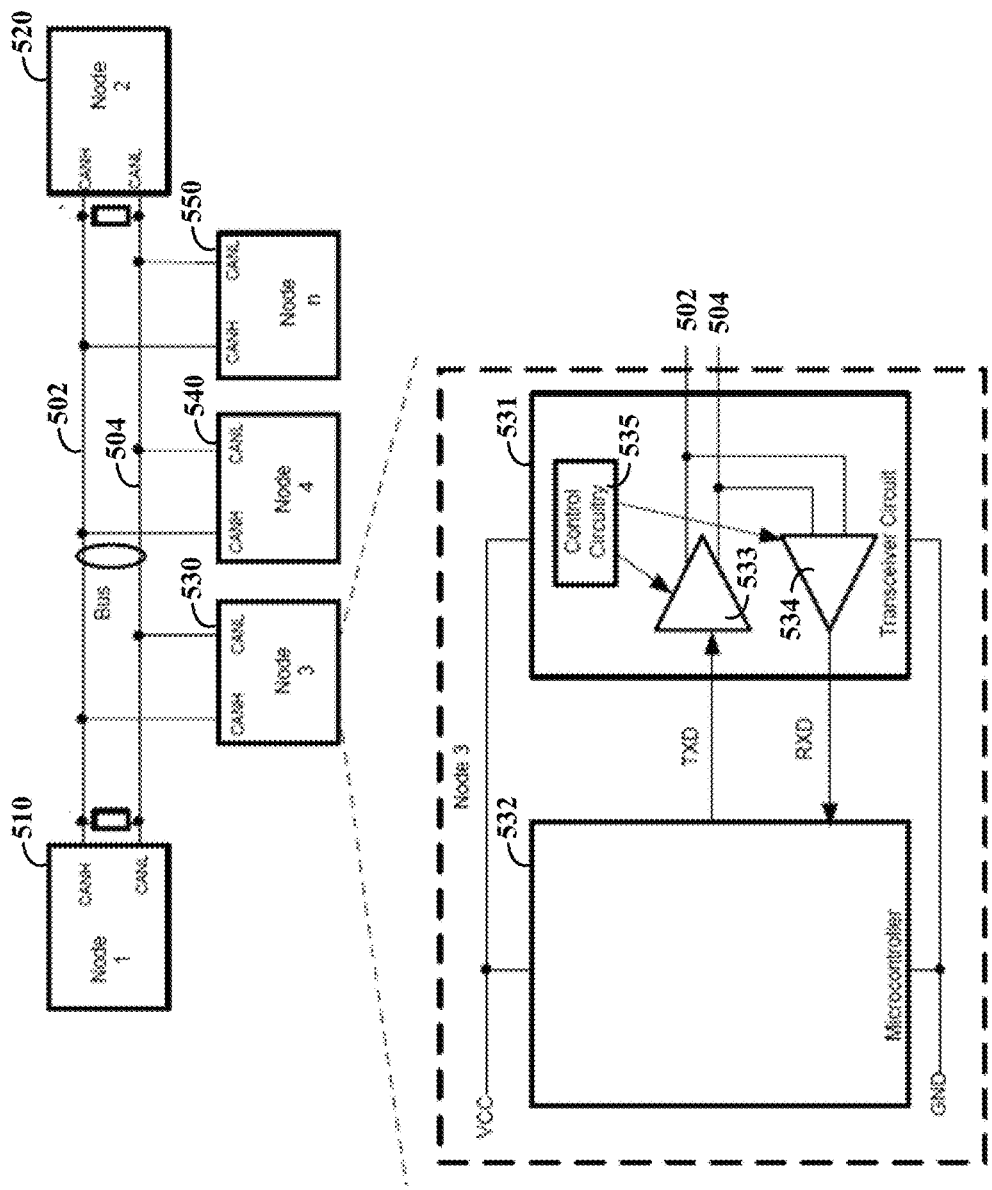
FIG. 5 shows a system-level diagram with which various testing approaches may be implemented, in accordance with the present disclosure.

FIG. 5 shows a system-level diagram of a communication system 500, with which various testing approaches may be implemented, in accordance with the present disclosure. The system 500 includes a two-wire communication bus having signal lines 502 and 504, upon which communications are effected by providing a voltage differential (potential) between the lines. The presence of an applied voltage potential can be interpreted as a dominant bit, and the absence of an applied potential (during an expected communication period) can be interpreted as a recessive bit.

The communication bus can be utilized with a multitude of circuit nodes, with nodes 510, 520, 530, 540 and 550 shown by way of example. One or more of the nodes can be utilized to generate test signals, and to listen for responses that characterize the ability of the other nodes to receive the test signals. Node 530 is shown being utilized as a test node, for providing a test signal having a lower amplitude relative to a design amplitude at which the respective nodes are designed to communicate. The node 530 includes a microcontroller 532 and a transceiver circuit 531, which has a transmitter 533 and receiver 534, which operate in accordance with control circuitry 535 to transmit and receive signals on signal lines 502 and 504.

The circuit node 530 operates by applying a voltage across signal lines 502 and 504 with the transmitter 533 for providing the test signals at the reduced amplitude. These test signals are provided at the direction of the microcontroller 532, which may direct that the signals are provided at a lower amplitude, and during a timing that is expected to elicit a response from the other circuit nodes, in accordance with a communication protocol used by all circuit nodes. The receiver 534 provides signals received on the signal lines 502 and 504 to the microcontroller 532. The microcontroller 532 can then assess the signals and, in response to the signals not following an expected response, provide an indication of an issue with the communication system 500.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, node, transceiver, microprocessor and/or other circuit-type depictions (e.g., reference numerals 110, 120, and 530 of FIGS. 1 and 5 may depict circuitry as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 3 and 4. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, or activities. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to generate . . . " is interpreted as "circuit configured to generate . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, a test signal having a reduced differential voltage can be provided using resistors, or by operating a microcontroller to drive circuitry to generate the test signal with the reduced differential voltage, or by using a combination thereof. With utilization of a microcontroller, the voltage differential can be adjusted for iterative testing as characterized herein. As another example, two or more nodes in a system may carry out testing as characterized herein. This approach can be used, for example, where a node used for testing is later tested itself, by another node used for testing. Such modifications do not depart from the true spirit and scope of various aspects of the disclosure, including aspects set forth in the claims.

What is claimed is:

1. An apparatus comprising:
a microcontroller;
a transmitter configured and arranged to transmit signals from the microcontroller to signal lines of a bus; and
a receiver configured and arranged to receive signals communicated over signal lines of the bus and to provide the received signals to the microcontroller, the microcontroller being configured and arranged with the transmitter and the receiver to carry out a test protocol for assessing integrity of the bus or of circuitry connected to the bus, by:
transmitting an initial test bit sequence to a plurality of circuit nodes connected to the bus by providing a test voltage across the signal lines, the potential of the test voltage being less than an operating voltage potential at which the circuit nodes connected to the bus operate for communicating bits,
after transmitting the initial test bit sequence, sensing a state of the bus via the receiver, and
determining whether all of the circuit nodes received the initial test bit sequence, based on the sensed state of the bus and on a state that the bus is expected to be in after transmission of the initial test bit sequence.

2. The apparatus of claim 1, wherein the microcontroller is configured and arranged to, in response to the test protocol indicating that at least one of the circuit nodes did not receive the initial test bit sequence, communicate an output indicative of a potentially faulty circuit connection to one of the circuit nodes.

3. The apparatus of claim 1, wherein the microcontroller is configured and arranged to determine that at least one of the circuit nodes did not receive the initial test bit sequence in response to the sensed state being indicative of a response from one of the nodes that is different than an expected response of the node to the initial test bit sequence.

4. The apparatus of claim 1, wherein the bus is a serial bus over which the microcontroller and the circuit nodes communicate in accordance with a serial communication protocol, and wherein determining whether all of the circuit nodes received the initial test bit sequence based on the sensed state of the bus includes assessing the sensed state of the bus in a accordance with an expected state of the bus as dictated by the serial communication protocol and the initial test bit sequence.

5. The apparatus of claim 1, wherein
the bus operates in a dominant state and in a recessive state for respectively communicating dominant bits and recessive bits, in which the dominant state exhibits the operating voltage potential for communicating data and in which the recessive state exhibits about no voltage differential between the signal lines, and in which the dominant state exhibits the test voltage for transmitting the test bit sequence during testing operations, and
the microcontroller is configured and arranged to determine whether all of the circuit nodes received the initial test bit sequence, based on an amount of time that the bus exhibits the dominant state or an amount of time that the bus exhibits the recessive state.

6. The apparatus of claim 1, wherein the microcontroller is configured and arranged to determine that none of circuit nodes received the initial test bit sequence in response to the sensed state of the bus being indicative of a lack of response from any of the circuit nodes.

7. The apparatus of claim 1, wherein the microcontroller is configured and arranged to determine that a first one of the circuit nodes did not receive the initial test bit sequence in response to the sensed state of the bus being indicative of:
a second one of the circuit nodes transmitting a response bit to the initial test bit sequence, and
the first one of the circuit nodes generating an error bit in response to the response bit, the error bit being indicative of the second one of the circuit nodes failing to receive the initial test bit sequence.

8. The apparatus of claim 1, wherein
the bus is a two-wire bus that communicates dominant and recessive bits in accordance with a dominant state and a recessive state, the dominant state exhibiting a voltage differential between the two wires, and
the microcontroller is configured and arranged to determine that at least one of the circuit nodes did not receive the initial test bit sequence in response to an amount of time that the bus exhibits the dominant state exceeding an expected amount of time that the bus exhibits the dominant state.

9. The apparatus of claim 8, wherein the microcontroller is configured and arranged to determine that one of the circuit nodes did not receive the initial test bit sequence by detecting a dominant error bit sent by the node that did not receive the initial test bit sequence.

10. The apparatus of claim 9, wherein an amount of the dominant error bits is indicative of a protocol error detected by the node that did not receive the initial test bit sequence.

11. The apparatus of claim 1, further including resistor circuits configured and arranged to facilitate the providing of the reduced voltage potential by reducing the amplitude of signals transmitted via the transmitter.

12. The apparatus of claim 1, wherein the microcontroller is configured and arranged to facilitate the providing of the reduced voltage potential.

13. The apparatus of claim 1, wherein the steps of transmitting the initial test bit sequence, sensing the state of the bus, and determining whether all of the circuit nodes received the initial test bit sequence, are iteratively carried out at respectively reduced test voltage differentials until one of the circuit nodes fails to receive the initial test bit sequence.

14. The apparatus of claim 1, wherein the microcontroller is configured and arranged to:
transmit the initial test bit sequence between respective communication frames defined by a communication protocol being implemented by the circuit nodes on the bus and utilizing the operating voltage potential, where the protocol dictates that communications are not to be carried out during the time between the respective communication frames, and
sense responses of the circuit nodes that are, in accordance with the communication protocol, generated when an unexpected bit is detected during the time between the communication frames, therein facilitating evaluation of the circuit nodes during implementation of the communication protocol and without using time frames otherwise used for communication in accordance with the communication protocol.

15. An apparatus comprising:
a data bus including two signal lines;
a plurality of circuit nodes connected to the bus, each circuit node being configured and arranged to communicate signals on the bus serially, relative to the other circuit nodes, by providing a voltage potential across the signal lines in accordance with a communications protocol; and in at least one of the plurality of circuit nodes, logic and transmission circuitry configured and arranged to assess integrity of the bus or of circuitry connecting the plurality of circuit nodes to the bus, by:

transmitting a test signal on the bus, the test signal exhibiting a voltage potential and timing that causes other ones of the plurality of circuit nodes that receive the test signal to generate a response signal in accordance with the communications protocol, in response to detecting a response from one of the circuit nodes that is indicative, in accordance with the communications protocol, that the one of the circuit nodes failed to receive the test signal and received the response signal from one of the other circuit nodes, generating an output indicative of a potential failure in the one of the circuit nodes.

16. A method comprising:

transmitting an initial test bit sequence to a plurality of circuit nodes connected to signal lines of a bus by providing a test voltage across the signal lines in accordance with a test protocol, the test voltage potential being less than an operating voltage potential at which the circuit nodes connected to the bus operate for communicating bits according to a communication protocol;

after transmitting the initial test bit sequence, sensing a state of the bus; and assessing integrity of the bus or of circuitry connected to the bus by determining whether all of the circuit nodes received the initial test bit sequence, based on the sensed state of the bus and on a state that the bus is expected to be in after transmission of the initial test bit sequence as specified via the communication protocol.

17. The method of claim 16, further including, in response to determining that at least one of the circuit nodes did not receive the initial test bit sequence, communicating an output indicative of a potentially faulty circuit connection to one of the circuit nodes.

18. The method of claim 16, wherein determining whether all of the circuit nodes received the initial test bit sequence includes detecting that one of the circuit nodes did not receive the initial test bit sequence, in response to the sensed state being indicative of a response from the one of the circuit nodes that is different than an expected response of the one of the circuit nodes to the initial test bit sequence.

19. The method of claim 18, wherein detecting that the one of the circuit nodes did not receive the initial test bit sequence includes detecting that the one of the circuit nodes responds to a signal transmitted by of one of the other circuit nodes in response to the initial test bit sequence.

20. The method of claim 16, wherein determining that one of the circuit nodes did not receive the initial test bit sequence includes detecting an error bit sent, in accordance with the communication protocol, by one of the circuit nodes that did not receive the initial test bit sequence.

* * * * *